United States Patent [19]
Faue

[11] Patent Number: 6,008,688
[45] Date of Patent: Dec. 28, 1999

[54] APPARATUS, AND ASSOCIATED METHOD, FOR PREVENTING OCCURRENCE OF LATCH-UP IN AN ELECTRONIC CIRCUIT

[75] Inventor: Jon Allan Faue, Colorado Springs, Colo.

[73] Assignees: United Memories, Inc., Colorado Springs, Colo.; Nippon Steel Semiconductor Corporation, Tateyama, Japan

[21] Appl. No.: 09/050,309

[22] Filed: Mar. 30, 1998

[51] Int. Cl.⁶ ................................................. H03K 17/16
[52] U.S. Cl. ............................................ 327/530; 327/535
[58] Field of Search .................................. 327/534–537; 363/60; 365/226

[56] References Cited

U.S. PATENT DOCUMENTS

| | | | |
|---|---|---|---|
| 5,321,324 | 6/1994 | Hardee et al. | 326/26 |
| 5,789,967 | 8/1998 | Katoh | 327/534 |
| 5,841,314 | 11/1998 | Brigati et al. | 327/536 |

*Primary Examiner*—Tuan T. Lam
*Attorney, Agent, or Firm*—William J. Kubida; Hogan & Hartson

[57] ABSTRACT

A latch-up protector, and an associated method, for an electronic circuit powered by both a fixed power supply and a pumped power supply. Operation of the latch-up protector prevents the occurrence of latch-up of the circuit during powering-up of the circuit. During powering-up of the electronic circuit, the latch-up protector prevents the application of an input signal to the electronic circuit which might instigate the occurrence of latch-up until the pumped power supply reaches a selected voltage level.

18 Claims, 3 Drawing Sheets

APPARATUS, AND ASSOCIATED METHOD, FOR PREVENTING OCCURRENCE OF LATCH-UP IN AN ELECTRONIC CIRCUIT

The present invention relates, in general, to apparatus, and an associated method, for preventing occurrence of latch-up in an electronic circuit. More particularly, the present invention relates to a latch-up preventor, and an associated method, for preventing occurrence of latch-up during powering up of an integrated circuit device which is coupled to a pumped power supply and to a fixed power supply. The latch-up preventor prevents application of input currents to at least selected portions of the integrated circuit device until the pumped power supply is of a level at least as great as the fixed power supply, thereby to prevent the possibility of occurrence of latch-up of the device.

In one implementation, the latch-up preventor forms a portion of an integrated circuit, voltage translator operable to translate the voltage of an input signal provided thereto into a signal exhibiting a translated voltage level. The latch-up preventor is of simplified circuit complexity and, when forming a portion of a voltage translator, permits almost any signal to be level-shifted up to a pumped supply level. The input signal, as well as the circuit device which originates the input signal need not include special features to prevent the occurrence of latch-up. Latch-up prevention is provided entirely by the latch-up preventer.

BACKGROUND OF THE INVENTION

A vast array of electronic circuits have been implemented in the form of integrated circuits utilizing semi-conductor materials. Large numbers of circuit components are integrated upon a single integrated circuit to permit an electronic circuit formed therefrom to be of very small dimensions.

Continued advancements in the field of integrated circuit design have permitted increased miniaturization of the circuit components forming the electronic circuits implemented in integrated circuits.

Circuit elements of an integrated circuit are formed of groups of P-N regions. To facilitate circuit operation, during powering-up, charge pumping of selected portions of such groups of P-N regions is sometimes performed. Charge pumping is a relatively slow process by which to bias a region of an integrated circuit, at least relative to the significantly greater rate at which a fixed power supply can bias a region of an integrated circuit.

The relative time lag of biasing of an integrated circuit region by charge pumping relative to the application of another region of the integrated circuit with a fixed power supply can lead to a problem referred to as "latch-up". Injection of currents into an integrated circuit coupled to be biased both by a fixed supply and by charge pumping can instigate the occurrence of latch-up of the circuit device.

U.S. Pat. No. 5,321,324, assigned to the assignee of the present invention, discloses, inter alia, a voltage translator with latch-up immunity. Current injection which might otherwise instigate latch-up of the voltage translator disclosed therein is prevented until the charge-pumped regions of the integrated circuit forming the voltage translator are of levels great enough such that latch-up of the translator shall not occur.

A voltage translator translates the voltage levels of an input signal into a translated voltage level to form a translated signal of a translated voltage level. A voltage translator is utilized, for instance, in an electronic circuit which has both low and high voltage requirements. A DRAM (dynamic random access memory) is exemplary of an electronic circuit which has both low and high voltage requirements. Low voltages are required for normal operation of the DRAM, whereas the higher voltages may be used to write, restore, or refresh a high-voltage value stored in a memory cell. Translated voltages may also be utilized to form other signals, such as control signals utilized during operation of such a circuit.

Other electronic circuits embodied in integrated circuit devices in which charge pumping is utilized are similarly susceptible to the occurrence of latch-up. A manner by which to prevent latch-up is necessary to ensure proper functioning of the electronic circuit and to prevent damage to the circuit.

While the latch-up immunity provided to the voltage translator disclosed in the aforementioned U.S. Pat. No. 5,321,324 prevents the occurrence of latch-up, such protection is provided through the use of a plurality of circuit elements. And, when the injection of the current is permitted, once the charge pumping biases the integrated circuit regions to an appropriate level, the signal permitted to be applied to the voltage translator is inverted.

Any manner by which to reduce the number of circuit elements required to prevent the occurrence of latch-up would advantageously facilitate the reduction in chip-space required to implement an electronic circuit including circuitry for preventing circuit latch-up.

A manner by which to permit the injection of current to the electronic circuit when such injection would not instigate the occurrence of latch-up without inverting the current signal, would also be advantageous.

It is in light of this background information related to integrated circuit devices that the significant advantages of the present invention have evolved.

SUMMARY OF THE INVENTION

The present invention, accordingly, advantageously provides apparatus, and an associated method, for preventing the occurrence of latch-up in an electronic circuit embodied in an integrated circuit. Prevention of occurrence of latch-up is provided by a minimal number of circuit elements. And, injection of current which might instigate the occurrence of latch-up in the electronic circuit is prevented until the electronic circuit is no longer susceptible to the occurrence of latch-up.

In one aspect of the present invention, the injection of current to an electronic circuit, which might otherwise instigate the occurrence of latch-up, is prevented until charge pumping of portions of the electronic circuit biases such portions to be at least as great as biasing levels of other portions of the electronic circuit with a fixed power supply. After the charge pumping biases the portions of the electronic circuit to such levels, injection of the current to the electronic circuit is permitted.

In one implementation, a latch-up preventor includes an n-type MOS (metal oxide semi-conductor) transistor. A gate electrode of the transistor is coupled to a pumped power supply used to charge pump portions of the electronic circuit. The remaining electrodes of the transistor are coupled to the electronic circuit and to receive an input signal generated by any selected source. The transistor thereby forms a switched connection for switchingly connecting the input signal to the electronic circuit. As application of the input signal to the electronic circuit prior to biasing of portions of the electronic circuit with a pumped power supply to a selected level might inject current into the circuit to instigate latch-up, the switch formed of the transistor is caused to be maintained in a turned-off position. Only when the pumped power supply is of a bias voltage great enough such that latch-up shall not occur is the switch formed of the transistor permitted to close, thereby to provide the input signal to the electronic circuit.

The latch-up preventor of an embodiment of the present invention is utilized in a voltage translator to selectively permit application of an input signal to the voltage translator. Only when the pumped power supply is of a level at which latch-up shall not occur is the input signal permitted to be applied to the voltage translator. In such an implementation, almost any signal can be level-shifted, as desired. That is to say, a circuit at which the input signal is originated need not include any special features. Latch up prevention can be handled by the latch-up preventor. The latch-up preventor can be used in other electronic circuits, such as, for example, logic devices, including those which perform NAND and NOR logic functions.

In these and other aspects, therefore, a latch-up preventor for preventing latch-up of an electronic circuit is provided. The electronic circuit is coupled to receive both a fixed power supply and a pumped power supply and has at least a first circuit portion. The latch-up preventor includes a switch element having a first side coupled to receive an input signal and a second side coupled to the first circuit portion of the electronic circuit. The switch element is positionable alternately in at least an open position and a closed position. Positioning of the switch element is operably controlled by values of the pumped power supply such that, when the switched power supply is of a value less than a selected level, the switch element is maintained in the open position. Application of the input signal to the first circuit portion is prevented. Thereby, latch-up of the electronic circuit is prevented.

The present invention and the scope thereof can be obtained from the accompanying drawings which are briefly summarized below, the following detailed description of the presently-preferred embodiments of the invention, and the appended claims.

DESCRIPTION OF A PREFERRED EMBODIMENT

Figure 1:
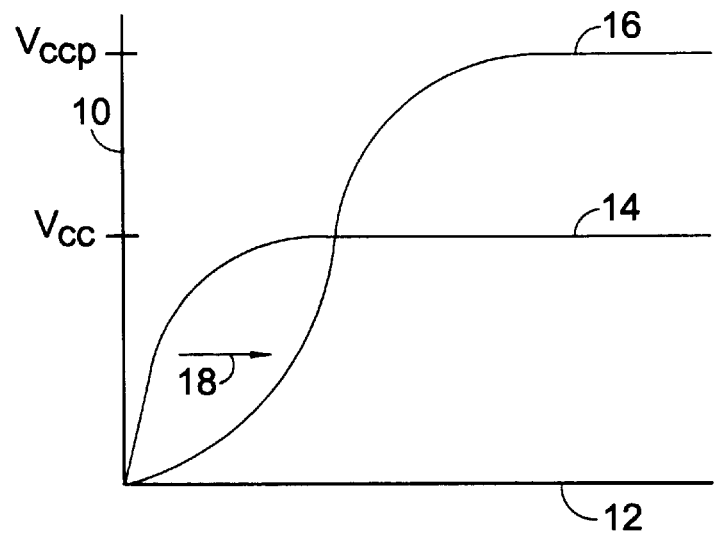
FIG. 1 illustrates a graphical representation of plots of voltages, taken as functions of time, generated by a fixed power supply and a pumped power supply.

Turning first to the graphical representation of FIG. 1, voltage levels provided by a fixed power supply and by a pumped power supply are plotted, scaled in terms of volts along the ordinate axis 10 taken as a function of time, plotted along the abscissa axis 12. The plot 14 represents the voltage levels provided to an integrated circuit by a fixed power supply during powering-up of the integrated circuit. As examination of the plot 14 indicates, a nearly-immediate voltage increase occurs during powering-up of the integrated circuit to the supply voltage $V_{cc}$.

The plot 16 is representative of the voltage level of a pumped power supply applied to the integrated circuit during powering-up of the integrated circuit. Analysis of the plot 16 indicates the voltage rise during powering-up of the integrated circuit not to be nearly-immediate, in contrast to the voltage rise of the fixed power supply. The pumped power supply eventually provides a bias indicated by $V_{ccp}$.

The relative time lag of the voltage provided by the pumped power supply relative to the fixed power supply is indicated in the Figure by the arrow 18. Such voltage level disparity during the initial stages of powering-up of the integrated circuit gives rise to the possibility of the occurrence of latch-up, as noted previously. The occurrence of latch-up becomes particularly problematical if current, such as that of an input signal, is injected into the integrated circuit during powering-up of the circuit. Injection of the current into the integrated circuit is prevented until the pumped power supply reaches a selected voltage level. Namely, current injection is prevented until the pumped power supply provides voltages of levels great enough so that latch-up shall not occur. Thereby latch-up of the circuit shall not occur.

Figure 2:
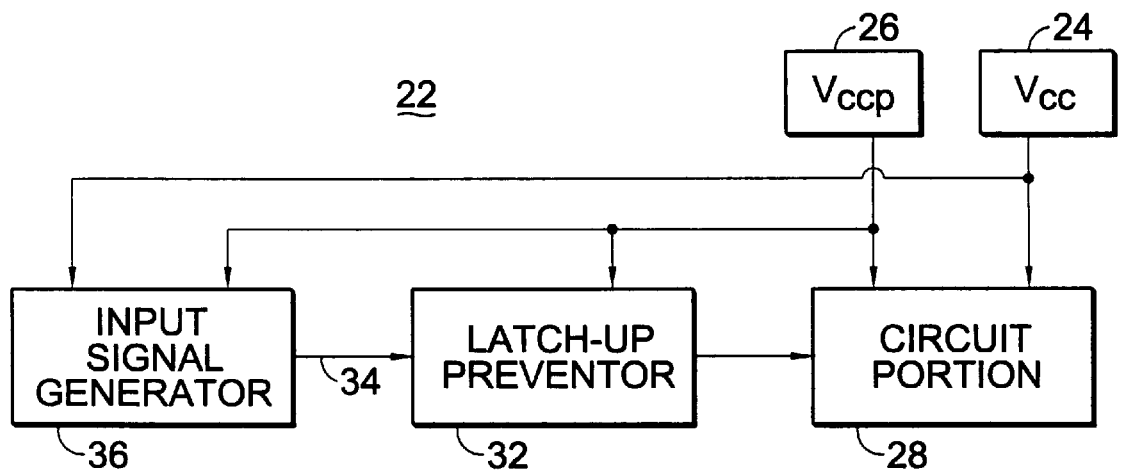
FIG. 2 illustrates a functional block diagram of an electronic circuit in which a latch-up preventor of an embodiment of the present invention is embodied.

FIG. 2 illustrates an electronic circuit, shown generally at 22, of an embodiment of the present invention. The circuit 22 is implemented in an integrated circuit and includes portions which are powered by both a fixed power supply 24 and a pumped power supply 26. The voltage characteristics of the power supplies 24 and 26 correspond to the plots 14 and 16, respectively, shown in FIG. 1. The electronic circuit 22 includes a circuit portion 28 having portions powered both by the fixed power supply 24 and the pumped power supply 26. In an exemplary embodiment, the circuit portion 28 forms a gain element having one or more gain element stages.

During powering-up of the circuit, the time lag of voltage levels provided by the pumped power supply 26 relative to the voltage levels provided by the fixed power supply 24 makes the circuit susceptible to the occurrence of latch-up.

To prevent such occurrence, the circuit 22 includes a latch-up preventor 32. The latch-up preventor is here shown to be coupled to the pumped power supply 26 to be operably responsive thereto. The latch-up preventor 32 is coupled in series between the circuit portion 28 and the line 34. An input signal, here generated by an input signal generator 36 is provided on the line 34 to the latch-up preventor 32. The latch-up preventor 32 is operable to selectively apply the input signal generated on the line 34 to the circuit portion 28.

The input signal generated on the line 34 is permitted to be applied to the circuit portion 28 by the latch-up preventor 32 only when the pumped power supply biases the circuit portion 28 at a level great enough that latch-up shall not occur upon injection of a current to the gain element. Once the voltage levels provided by the pumped power supply are great enough that latch-up shall not occur, the latch-up preventor 32 permits the application of the input signal generated on the line 34 to the circuit portion 28. The latch-up preventer thereby is functionally operable as a switching device, operable selectively to apply the input signal to the gain element.

The input signal generated on the line 34 may be generated by any of many input signal sources. While the exemplary embodiment of the electronic circuit 22 shown in FIG. 2 includes an input signal generator 36 as a portion thereof, in other embodiments, the input signal generated on the line 34 is generated by an external source and is merely applied to the latch-up preventor 32. The input signal generator 36 may, for example, perform a logic function, such as a NOR function or a NAND function. In the exemplary embodiment, the input signal generator 36 is also shown to be coupled to both the fixed power supply 24 and the pumped power supply 26. In other embodiments, the input signal generator 36 is powered in other manners.

Figure 3:
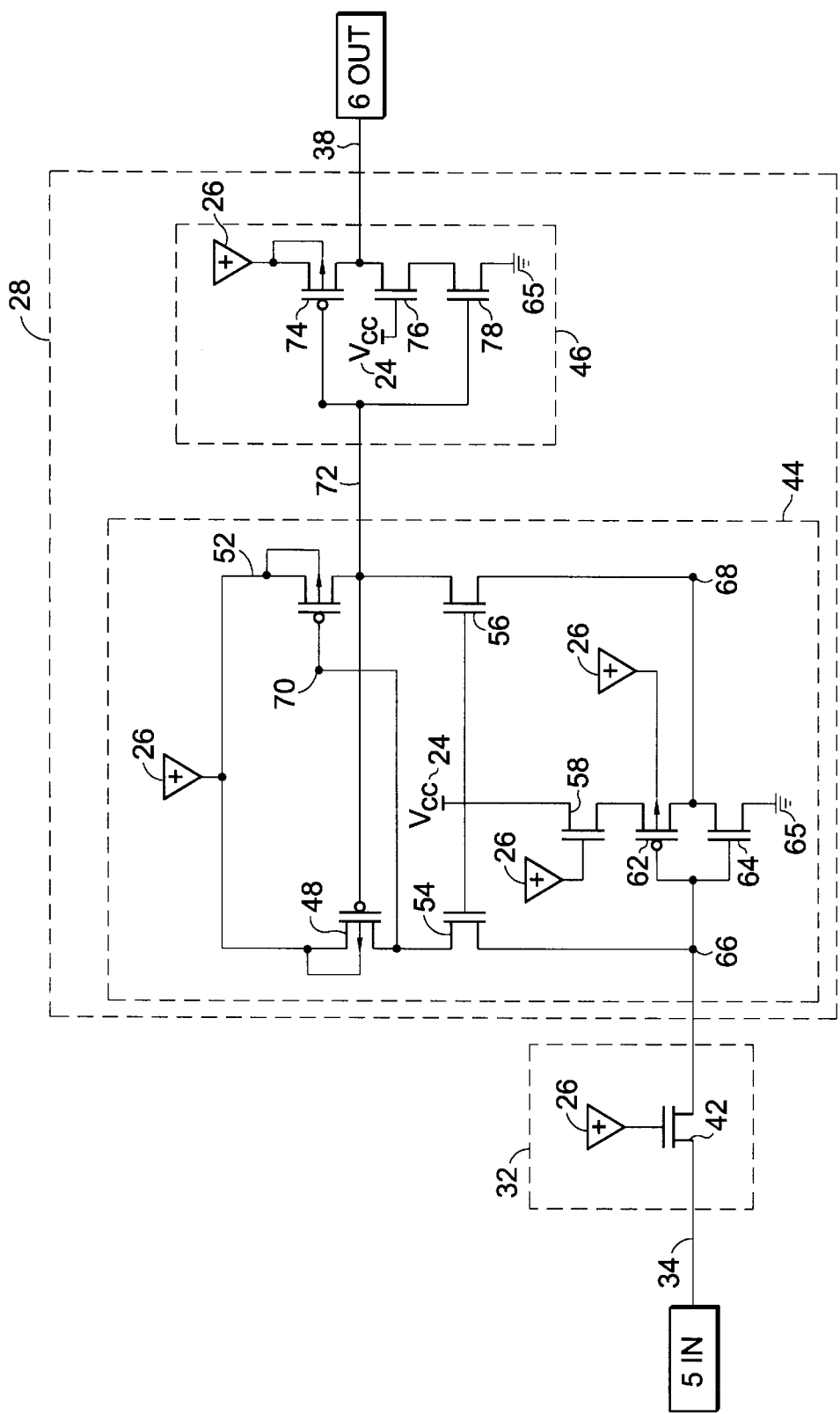
FIG. 3 illustrates a circuit schematic of a voltage translator of an embodiment of the present invention.

FIG. 3 illustrates a voltage translator forming the electronic circuit 22 of an embodiment of the present invention. The voltage translator is operable to translate, here upwardly, the voltage levels of an input signal generated on the line 34 into a voltage-translated signal generated by the circuit portion 28 on the line 38. Here, the circuit portion 28 is formed of a gain element which shall hereafter be like-referred by reference numeral 28. The voltage translator forming the electronic circuit 22 is again shown to include a latch-up preventor 32.

The latch-up preventor 32 is here shown to be formed of an n-type, MOS (metal oxide semiconductor) transistor 42 having source and drain electrodes coupled between the line 34 and the gain element 28. The gate electrode of the transistor 42 is coupled to the pumped power supply 26 to be operably controlled thereby. When the voltage level of the pumped power supply is less than the turn-on voltage of the transistor 42, an open circuit is maintained to prevent application of the input signal generated on the line 34 to the gain element forming the circuit portion 28. When the voltage level of the pumped power supply reaches the turn-on voltage of the transistor 42, the transistor 42 is turned-on, thereby to provide the signal generated on the line 34 to the gain element forming the circuit portion 28. Through appropriate selection of the characteristics of the transistor 42, the input signal generated on the line 34 is applied to the circuit portion 28 subsequent to powering-up of the circuits 22 only when the application of such signal to the gain element shall not instigate the occurrence of latch-up. In such manner, when the transistor 42 is turned-on, the input signal is applied to the circuit portion 28 so that a voltage-translated signal can be formed therefrom on the line 38. And, as the input signal is applied to the circuit portion 28 merely by closing of the transistor 42, the input signal is applied to the circuit portion 28 in non-inverted form.

The gain element forming the circuit portion 28 is here shown to be formed of a first stage 44 and a second stage 46, here to form a non-inverted, voltage-translated output signal on the line 38. The first stage 44 includes transistors 48 and 52 coupled to the pumped power supply 26, and transistors 54, 56, and 58 coupled to the fixed power supply 24. A gate electrode of the transistor 58 is also coupled to the pumped power supply 26. The transistor 58 is also positioned in cascade with transistors 62 and 64. The transistor 62 is also coupled to the pumped power supply 26, and the transistor 64 is coupled to an electrical ground 65. Additional details related to the first stage 44 are described in the aforementioned U.S. Pat. No. 5,321,324, the contents of which are incorporated by reference herein. Configured in manners, as illustrated, the first stage 44 defines several nodes, including, inter alia, nodes 66, 68 and 70.

The first stage 44 generates an inverted signal on the line 72 which is coupled to the second stage 46. The second stage 46 is here shown to be formed of three cascaded-together transistors 74, 76, and 78. The transistor 74 is coupled to the pumped power supply 26, the transistor 76 is coupled to the fixed power supply 24, and the transistor 78 is coupled to electrical ground 65. The second stage inverts the inverted signal applied thereto on the line 72, thereby to generate a non-inverted, voltage-translated signal on the line 38.

During powering-up of the circuit 22, because of the time lag of the pumped power supply relative to the fixed power supply, $V_{cc}$ is greater than $V_{ccp}$. Without the presence of the latch-up preventor 32, the voltage at node 66 may equal the voltage of the fixed power supply $V_{cc}$ and the voltage at the node 70 might equal the voltage of the fixed power supply minus a voltage drop $V_{tN}$ across the transistor 54. If the well of the transistor 48 becomes forward biased, latch-up of the circuit might occur. That is to say, if the voltage at the node 72 minus $V_{tN}$ minus 0.7 volts (the voltage across a forward biased P-N junction), is greater or equal to $V_{ccp}$ a "turned-on" transistor permits the occurrence of latch-up.

With the addition of the transistor 42 forming the latch-up preventor 32, the current at the node 66 is limited by the voltage applied to the gate electrode of the transistor 42. When the voltage of the pumped power supply is low, then the transistor 42 is maintained in the open position and the input signal is not applied to the node 66, viz., I=0.

The voltage at node 66 is equal to the voltage of the pumped power supply $V_{ccp}$ plus a voltage drop across the transistor 62. For latch-up to occur, the voltage at the node 66 less a voltage drop across the transistor 62 must be at least as great as the voltage of the pumped power supply, $V_{ccp}$, +0.7 volts.

However, if the voltage at the node 66 is equal to the voltage of the pumped power supply less the voltage across the transistor 62, then, for latch-up to occur:

$$V_{ccp} - V_{tN} - V_{tN} \geq V_{ccp} + 0.7 \text{ volts}$$

Simplification of such equation leads to:

$$-2V_{tN} > +0.7 \text{ volts}$$

As the values of $V_{tN}$ are positive, there is no possibility of latch-up.

The exemplary embodiment of the gain element 28 shown in FIG. 3 is formed of a two-stage element having first and second stages 44 and 46, respectively. When the input signal generated on the line 34 is provided to the gain element 28, the two stages of the gain element ensure that the voltage-translated signal generated on the line 38 is non-inverted relative to the input signal. In another embodiment, an inverted, voltage-translated signal is generated through the use of a single stage, or an odd number of, stages.

Figure 4:
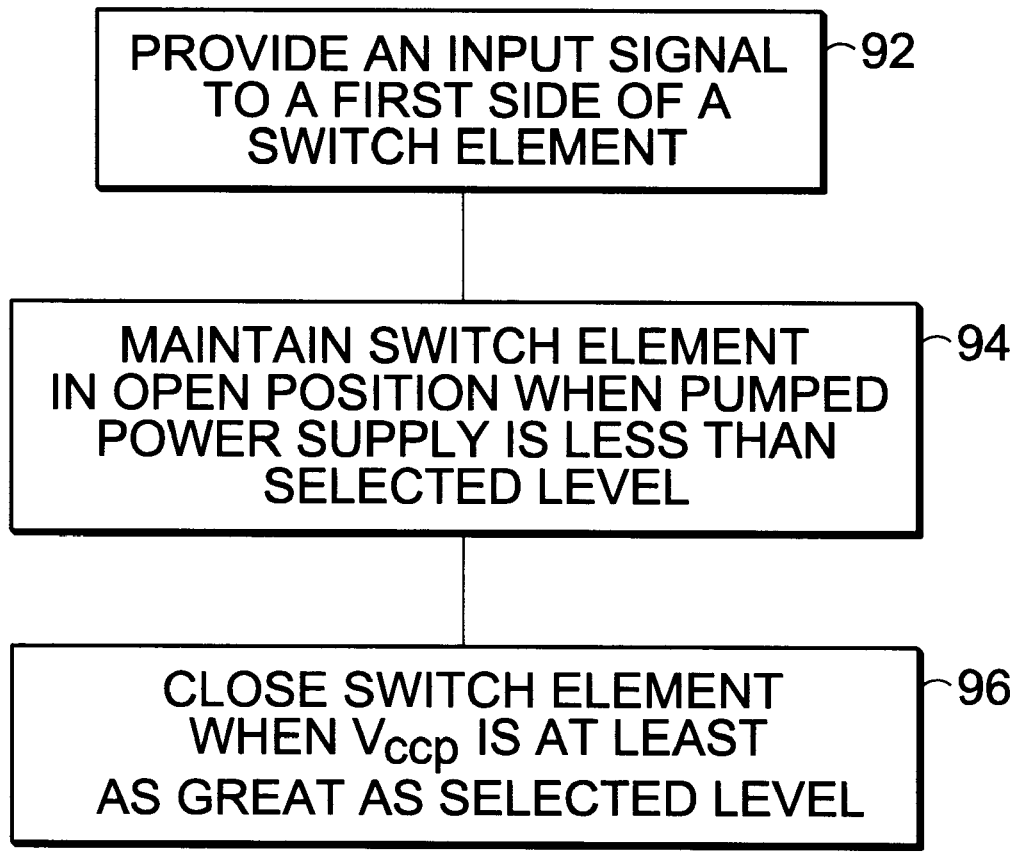
FIG. 4 illustrates a method flow diagram of the method of an embodiment of the present invention.

FIG. 4 illustrates a method flow diagram, shown generally at 88, of an embodiment of the present invention. Operation of the method 88 prevents latch-up of an electronic circuit coupled to receive both a fixed power supply and a pumped power supply, and the electronic circuit includes at least one gain element stage. First, and as indicated by the block 92, an input signal is provided to a first side of a switch element. The switch element also has a second side coupled to the at least one gain element stage of the electronic circuit. Then, and as indicated by the block 94, the switch element is maintained in an open position when the pumped power supply is of a value less than a selected level, thereby to prevent application of the input signal to the at least one gain element stage. Then, and as indicated by the block 96, the switch element is closed into a closed position when the value of the pumped power supply is at least as great as the selected level.

Operation of an embodiment of the present invention thereby provides latch-up protection for virtually any electronic circuit which might be susceptible to the occurrence of latch-up. The latch-up protector is positioned in-line with the electronic circuit to form a portion thereof and to receive an input signal. All of the required latch-up protection is handled by the latch-up protector. In one implementation, the latch-up protector is embodied in a circuit forming a voltage translator operable to generate a voltage-translated signal responsive to an input signal provided thereto.

The previous descriptions are of preferred examples for implementing the invention and the scope of the invention should not necessarily be limited by this description. The scope of the present invention is defined by the following claims.

It is claimed:

1. In an electronic circuit coupled to receive both a fixed power supply and a pumped power supply and having at least a first circuit portion, an improvement of a latch-up preventor for preventing latch-up of the electronic circuit, said latch-up preventor comprising:

a switch element having a first side coupled to receive an input signal and a second side coupled to the at least the first circuit portion of the electronic circuit, said switch element positionable alternately in at least an open position and a closed position, positioning of the switch element operably controlled by values of the pumped power supply such that, when the pumped power supply is of a value less than a selected level, said switch element is maintained in the open position to prevent application of the input signal to the at least the first circuit portion, thereby to prevent latch-up of the electronic circuit.

2. The latch-up preventor of claim 1 wherein said switch element comprises a non-inverting switch element such that, when in the closed position, the input signal, to which the first side is coupled to receive, is provided, in non-inverted form, to the first circuit portion.

3. The latch-up preventor of claim 1 wherein the first circuit portion comprises at least one gain element stage forming a voltage translator, the voltage translator for translating voltage levels of the input signal to a translated voltage level when said switch element is in the closed position.

4. The latch-up preventer of claim 3 wherein the at least one gain element stage which forms the voltage translator comprises a single gain element stage, the translated voltage level further inverted relative to the input signal to which the first side of said switch element is coupled to receive.

5. The latch-up preventor of claim 3 wherein the at least one gain element stage which forms the voltage translator comprises a first gain element stage and a second gain element stage connected in series therewith, and wherein the translated voltage level into which the voltage levels of the input signal are translated are non-inverted relative to the input signal to which the first side of said switch element is coupled to receive.

6. The latch-up preventer of claim 1 wherein the selected level of the pumped power supply, beneath which said switch element is maintained in the open position, comprises a level at which the pumped power supply is at least as great as the fixed power supply.

7. The latch-up preventor of claim 1 wherein the at least first circuit portion of the electronic circuit comprises both a first circuit portion and a second circuit portion, and wherein the second circuit portion of the electronic circuit generates the input signal to which the first side of said switch element is coupled to receive.

8. The latch-up preventor of claim 7 wherein the first circuit portion of the electronic circuit to which the second side of said switch element is coupled forms a logical device for performing a logic function.

9. The latch-up preventor of claim 1 wherein said switch element comprises a transistor element.

10. The latch-up preventor of claim 9 wherein said transistor element comprises a metal oxide semiconductor transistor element.

11. The latch-up preventor of claim 10 wherein said metal oxide semiconductor transistor element includes a gate electrode coupled to the pumped power supply, said metal oxide semiconductor transistor element exhibiting a characteristic turn-on voltage, the characteristic turn-on voltage of a level to prevent turn-on of said metal oxide semiconductor transistor element until the pumped power supply is at least as great as the selected level.

12. An electronic circuit coupled to receive both a fixed power supply and a pumped power supply, said electronic circuit comprising:

a first circuit portion coupled to receive at least one of the fixed power supply and the pumped power supply, said first circuit portion for generating a first circuit signal;

a switch element having a first side and a second side, the first side of said switch element coupled to receive the first circuit signal, said switch element positionable alternately in at least an open position and a closed position, positioning of the switch element operably controlled by values of the pumped power supply such that, when the pumped power supply is of a value less than a selected level, said switch element is maintained in the open position;

a second circuit portion coupled to the second side of said switch element and coupled to receive at least one of the fixed power supply and the pumped power supply, said second circuit portion for receiving the first circuit signal when and only when the pumped power supply is of a value at least as great at the selected level and said switch element is in the closed position.

13. The electronic circuit of claim 12 wherein said switch element comprises a non-inverting switch element such that, when in the closed position, the first circuit signal, to which the first side is coupled to receive, is provided, in non-inverted form, to said second circuit portion.

14. A method for preventing latch-up of an electronic circuit coupled to receive both a fixed power supply and a pumped power supply, the electronic circuit having at least a first circuit portion, said method comprising the steps of:

providing an input signal to a first side of a switch element, the switch element having a second side coupled to the at least the first circuit portion;

maintaining the switch element in an open position when the pumped power supply is of a value less than a selected level to prevent application of the input signal to the at least one gain element stage; and closing the switch element into a closed position when the value of the pumped power supply is at least as great as the selected level.

15. The method of claim 14 wherein, subsequent to closing of the switch element into the closed position during said step of closing, the input signal is provided in non-inverted form, to the first circuit portion.

16. The method of claim 14 comprising the additional step, subsequent to said step of closing the switch element, of translating voltage levels of the input signal provided to the first circuit portion to translated voltage levels.

17. The method of claim 16 wherein said step of translating the voltage levels further includes inverting values of the input signal.

18. The method of claim 14 further comprising the step, prior to said step of providing, of generating the input signal.

* * * * *